United States Patent
Kano et al.

[11] Patent Number: 6,101,707
[45] Date of Patent: Aug. 15, 2000

[54] MOUNTING HEAD FOR ELECTRONIC COMPONENT-MOUNTING APPARATUS

[75] Inventors: Yoshinori Kano; Yoshinao Usui; Ikuo Takemura; Takahiro Nagata, all of Gunma-ken, Japan

[73] Assignee: Sanyo Electric Co., Ltd., Osaka-fu, Japan

[21] Appl. No.: 09/260,179

[22] Filed: Mar. 1, 1999

[30] Foreign Application Priority Data

Mar. 3, 1998 [JP] Japan ................................. 10-067875
Sep. 24, 1998 [JP] Japan ................................. 10-270288

[51] Int. Cl.[7] ................................................. B23P 19/00
[52] U.S. Cl. ................................ 29/740; 29/742; 29/743
[58] Field of Search .............................. 29/740, 729, 742, 29/743, 739, 832, 834; 414/737; 318/567, 568.11; 294/2, 64.1; 228/180.1

[56] References Cited

U.S. PATENT DOCUMENTS

| | | | |
|---|---|---|---|
| 5,400,497 | 3/1995 | Watanabe et al. | 29/705 |
| 5,544,411 | 8/1996 | Kano et al. . | |
| 5,579,572 | 12/1996 | Kashiwagi | 29/836 |
| 5,628,107 | 5/1997 | Nushiyama et al. | 29/740 |
| 5,740,604 | 4/1998 | Kitamura et al. | 29/832 |
| 5,741,114 | 4/1998 | Onodera | 414/783 |
| 5,767,598 | 6/1998 | Kano et al. . | |
| 5,784,778 | 7/1998 | Yoshida et al. | 29/834 |
| 5,850,683 | 12/1998 | Okazaki et al. | 29/740 |

FOREIGN PATENT DOCUMENTS 0 691 804 A1   1/1996   European Pat. Off. .

*Primary Examiner*—S. Thomas Hughes
*Assistant Examiner*—Minh Trinh
*Attorney, Agent, or Firm*—Darby & Darby

[57] ABSTRACT

There is provided a mounting head for an electronic component-mounting apparatus. A nozzle holder has a plurality of suction nozzles arranged circumferentially about a vertical axis thereof in a manner such that each suction nozzle is capable of projecting from the nozzle holder and retracting in the nozzle holder. A holder support member supports the nozzle holder in a manner such that the nozzle holder can rotate about the vertical axis thereof. Rotation drive means drives the nozzle holder for rotation in normal and reverse directions. The nozzle holder is driven for rotation by the rotation drive means to bring one of the suction nozzles selected for use to a projecting position. The selected one is caused to project from a lower end face of the nozzle holder at the projecting position. A plurality of cam followers are mounted at respective upper portions of the suction nozzles. The cam followers are in contact with an annular end cam in a manner such that the cam flower can move on the annular end cam. The annular end cam is formed with a nozzle-projecting surface for causing one of the suction nozzles corresponding in position thereto to project from the nozzle holder.

5 Claims, 7 Drawing Sheets

MOUNTING HEAD FOR ELECTRONIC COMPONENT-MOUNTING APPARATUS

BACKGROUND OF THE INVENTION

1. Field of the Invention

This invention relates to a mounting head for use in an electronic component-mounting apparatus for picking up electronic components by vacuum and mounting the electronic components on a circuit board.

2. Prior Art

Conventionally, a mounting head for an electronic component-mounting apparatus of this kind has been proposed by Japanese Laid-Open Patent Publication (Kokai) No. 5-226884, which includes a nozzle holder having a plurality of suction nozzles mounted thereon in a manner capable of projecting and retracting vertically, and a holder support member secured to a bracket mounted on a body of the electronic component-mounting apparatus, for rotatably supporting the nozzle holder via a pair of upper and lower bearings. The nozzle holder has a hook support member mounted at an upper portion thereof. The hook support member has a plurality of engaging hooks corresponding to the suction nozzles, respectively, and extending perpendicularly downward from the hook support member in a pivotally movable manner. Further, the hook support member has an upper end surface thereof formed with engaging grooves for engagement with an output end of a rotation drive mechanism arranged in the apparatus body. That is, the output end of the rotation drive mechanism engages with the engaging groove to drive the nozzle holder for rotation, whereby one of the suction nozzles selected for use is brought to a projecting position.

Each of the suction nozzles has a hook-catching member fixed to an upper portion thereof for engagement with a corresponding one of the engaging hooks. Retraction of the suction nozzles into the nozzle holder is effected by lowering the mounting head and causing the suction nozzles to strike against a nozzle stopper, while downward projection of a selected suction nozzle from the nozzle holder is effected by pivotally moving a corresponding one of the engaging hooks by a disengaging mechanism provided in the apparatus body, to disengage the engaging hook from a corresponding one of the hook-catching members. That is, in changing (switching) suction nozzles in use, the nozzle holder is rotated to bring a suction nozzle selected for use in a next mounting operation to a projecting position, then all the suction nozzles are struck against the stopper to be once retracted into the nozzle holder, and thereafter, only the selected suction nozzle is caused to project.

As described above, in the conventional mounting head, all the suction nozzles are required to be struck against the stopper before causing one of the suction nozzles to project for use. Since this operation is repeatedly carried out, the striking end of each suction nozzle is worn away or deformed, which inevitably shortens the service life of the suction nozzle. Further, it is required to bring the suction nozzles to the location of the nozzle stopper to carry out the retracting operation before causing the projection of the selected suction nozzle, and hence it takes a considerable time to cause the selected suction nozzle to project. This is a significant factor causing an increase in tact time of an overall operation for mounting electronic components on a circuit board.

SUMMARY OF THE INVENTION

It is an object of the invention to provide a mounting head for an electronic component-mounting apparatus, which is capable of increasing the service life of each suction nozzle, without causing any trouble in changing suction nozzles for use.

To attain the above object, the present invention provides a mounting head for an electronic component-mounting apparatus, including a nozzle holder having a plurality of suction nozzles arranged circumferentially about a vertical axis thereof in a manner such that each suction nozzle is capable of projecting from the nozzle holder and retracting in the nozzle holder, a holder support member supporting the nozzle holder in a manner such that the nozzle holder can rotate about the vertical axis thereof, and rotation drive means for driving the nozzle holder for rotation in normal and reverse directions, wherein the nozzle holder is rotated by the rotation drive means to bring one of the suction nozzles selected for use to a projecting position, and the selected one is caused to project from a lower end face of the nozzle holder at the projecting position.

The mounting head according to the present invention is characterized by comprising:

a plurality of cam followers mounted at respective upper portions of the suction nozzles; and an annular end cam with which the cam followers are in contact in a manner such that the cam flowers can move on the annular end cam, the annular end cam being formed with a nozzle-projecting surface for causing one of the suction nozzles corresponding in position thereto to project from the lower end face of the nozzle holder.

According to this electronic component-mounting apparatus, the nozzle holder is driven for rotation by the rotation drive means, whereby the suction nozzles arranged circumferentially on the periphery of the nozzle holder in a manner capable of projecting and retracting are moved about the vertical axis of the nozzle holder. The movement of each of the suction nozzles causes a cam follower mounted at the upper portion of the suction nozzle to move on a cam surface of the annular end cam. During this process, any one of the suction nozzles which is brought to the nozzle-projecting surface of the end cam is caused to project from the lower end face of the nozzle holder by cam action between the cam follower and the end cam, while the other suction nozzles on the cam surface other than the nozzle-projecting surface are each held in a retracted state. Therefore, it is possible to cause only the selected one of the suction nozzles to project at a desired projecting position, by moving the nozzle-projecting surface to the desired projecting position in advance, and then moving the selected suction nozzle (more specifically, the cam follower of the same) to the position of the nozzle-projecting surface and stop thereat.

Preferably, the end cam has a lower portion interposed between the holder support member and the nozzle holder, and the mounting head includes a normal rotation clutch interposed between the nozzle holder and the lower portion of the end cam, for permitting only normal rotation of the nozzle holder, and a reverse rotation clutch interposed between the holder support member and the lower portion of the end cam, for permitting only reverse rotation of the nozzle holder.

According to this preferred embodiment, when the nozzle holder is rotated in the normal direction, the nozzle holder alone is rotated with the end cam being held by the holder support member, due to one-directional rotating action of each of the normal rotation clutch and the reverse rotation clutch. That is, the suction nozzles held by the nozzle holder move about the vertical axis of the nozzle holder. On the other hand, when the nozzle holder is rotated in the reverse direction, the nozzle holder is rotated in unison with the end cam with respect to the holder support member due to one-directional rotating action of each of the two clutches. Therefore, it is possible to cause only one of the suction nozzles selected for use to project at a desired projecting position by rotating the nozzle holder in the reverse direction so as to bring the nozzle-projecting surface of the end cam to the desired projecting position, and then rotating the nozzle holder in the normal direction so as to bring the selected suction nozzle to the nozzle-projecting surface (i.e. the desired projecting position). Further, according to this preferred embodiment, the suction nozzles can be moved about the vertical axis of the nozzle holder in a projected state, and the projecting position can be adjusted to a change in position where a selected suction nozzle is to be caused to project.

More preferably, the mounting head further comprises cam position-detecting means for detecting a rotational position of the nozzle-projecting surface of the end cam, nozzle position-detecting means for detecting a rotational position of each of the suction nozzles on the nozzle holder, and control means for controlling the normal rotation and the reverse rotation of the nozzle holder driven by the rotation drive means, in response to respective detection signals from the cam position-detecting means and the nozzle position-detecting means.

According to this preferred embodiment, it is possible to always keep track of the rotational position of the nozzle-projecting surface and the rotational position of each of the suction nozzles with reference to results of detection by the cam position-detecting means and the nozzle position-detecting means, so that the nozzle-projecting surface can be moved to a desired projecting position, and a desired or selected one of the suction nozzles to the nozzle-projecting surface, by the control means. This makes it possible to automatically and easily cause projection of the suction nozzle selected for use.

In an alternative preferred form of the invention, the mounting head comprises a connecting member provided on the end cam, for selectively establishing a connection between the end cam and the nozzle holder or a connection between the end cam and the holder support member, and switching means for causing the connecting member to switch between the connections.

According to this preferred embodiment, when the nozzle holder is rotated by the rotation drive means after the switching means causes the connecting member to establish the connection between the end cam and the holder support member, the nozzle holder alone is rotated, with the end cam being held by the holder support member. That is, the suction nozzles held by the nozzle holder move about the vertical axis of the nozzle holder. On the other hand, when the nozzle holder is rotated by the rotation drive means after the switching means causes the connecting member to establish the connection between the end cam and the nozzle holder, the nozzle holder is rotated in unison with the end cam. Therefore, it is possible to cause only the selected one of the suction nozzles to project at a desired projecting position by rotating the end cam via the nozzle holder so as to move the nozzle-projecting surface of the end cam to the desired projecting position, and then rotating the nozzle holder alone so as to bring the selected suction nozzle (more specifically, the cam follower of the same) to the position of the nozzle-projecting surface (i.e. the desired projecting position). Further, according to this preferred embodiment, the suction nozzles can be moved about the vertical axis of the nozzle holder in a projected state, and the projecting position can be adjusted to a change in position where a selected suction nozzle is to be caused to project.

More preferably, the mounting head further comprises cam position-detecting means for detecting a rotational position of the nozzle-projecting surface of the end cam, nozzle position-detecting means for detecting a rotational position of the each of the suction nozzles on the nozzle holder, and control means for controlling the rotation of the nozzle holder driven by the rotation drive means and switching operation of the switching means, in response to respective detection signals from the cam position-detecting means and the nozzle position-detecting means.

According to this preferred embodiment, it is possible to obtain the same effect as provided by the mounting head according to the preferred embodiment of the invention, which has the two clutches as well as the cam position-detecting means, the nozzle position-detecting means, and the control means.

The above and other objects, features, and advantages of the invention will become more apparent from the following detailed description taken in conjunction with the accompanying drawings.

DETAILED DESCRIPTION

The invention will now be described in detail with reference to drawings showing embodiments thereof. In the embodiments, a mounting head according to the invention is installed on an electronic component-mounting apparatus.

Figure 1:
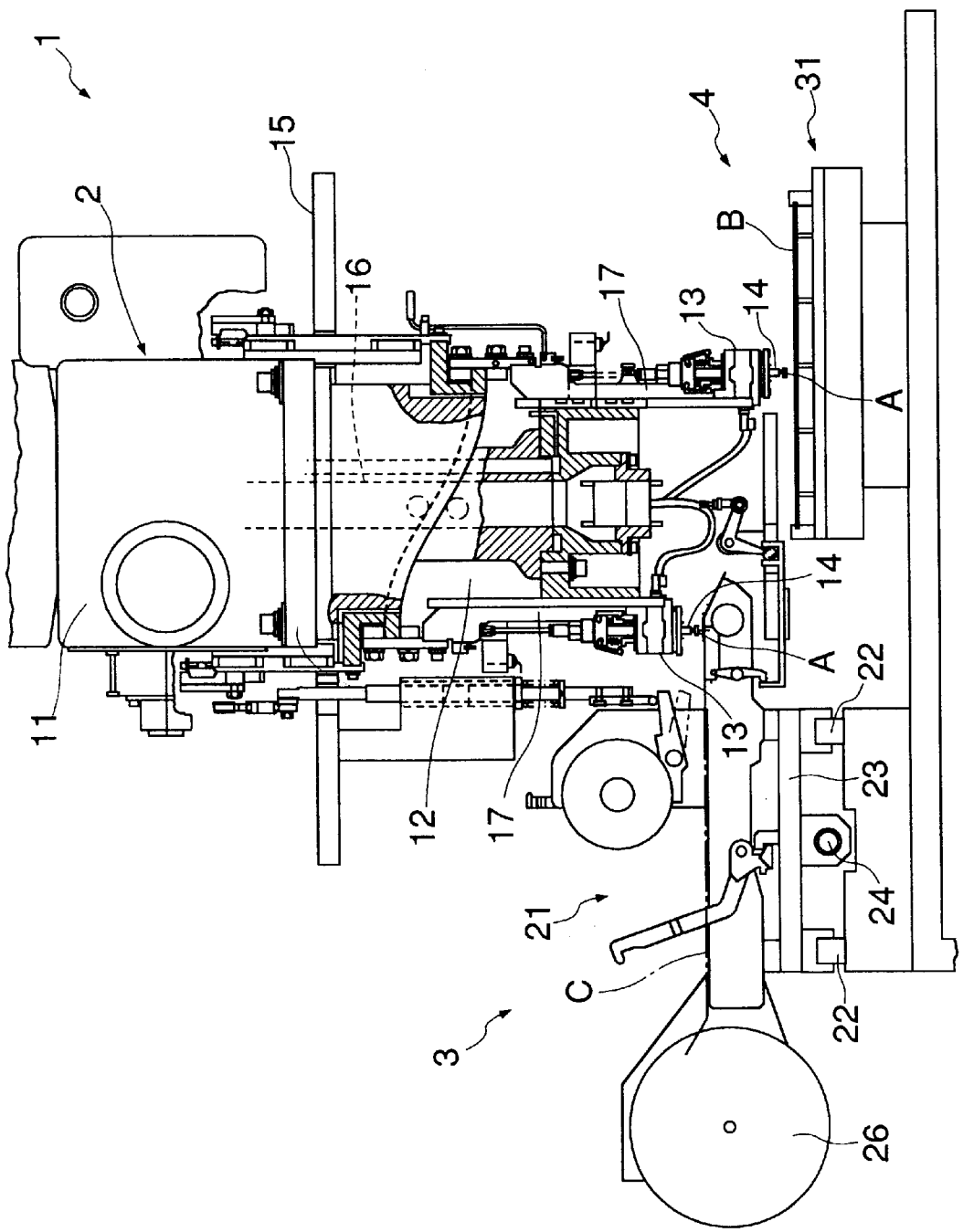
FIG. 1 is a side elevation of an electronic component-mounting apparatus on which is mounted a mounting head according to a first embodiment of the invention.
Figure 2:
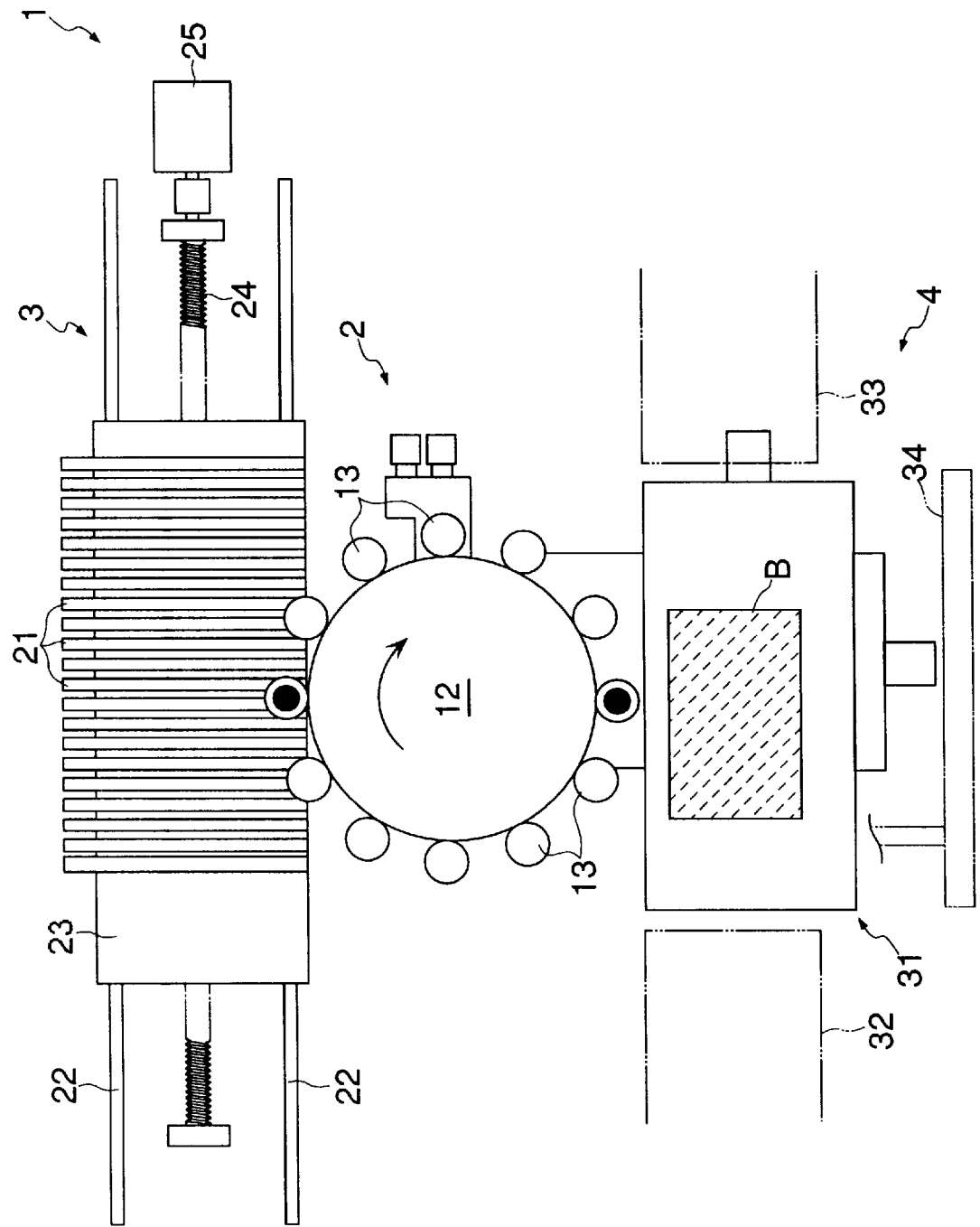
FIG. 2 is a plan view of the FIG. 1 electronic component-mounting apparatus.

Referring first to FIGS. 1 and 2, there is shown an electronic component-mounting apparatus 1 according to a first embodiment of the invention, which includes a main unit 2, a feeding section 3 for feeding electronic components A, and a mounting section 4 for mounting the electronic components A on a circuit board B, with the feeding section 3 and the mounting section 4 being arranged on opposite sides of the main unit 2 in a manner parallel to each other. The main unit 2 is comprised of an index unit 11 which forms a main part of the driving system of the apparatus, a rotary table 12 coupled thereto, and a plurality of (twelve, in the present embodiment) mounting heads 13 arranged on the outer periphery of the rotary table 12. The rotary table 12 is intermittently rotated by the index unit 11 in angular increments corresponding to the number of the mounting heads 13. With intermittent rotation of the rotary table 12, a selected one of suction nozzles 14 carried by each mounting head 13 is properly brought to the feeding section 3 and the mounting section 4, whereby each selected suction nozzle 14 sucks or picks up by vacuum an electronic component A supplied at the feeding section 3, carries the same to the mounting section 4 through intermittent rotation of the rotary table 12, and mounts the same on the circuit board B supplied at the mounting section 4.

The feeding section 3 has tape cassettes 21 corresponding in number to the number of kinds of electronic components A to be mounted on the circuit board B. The tape cassettes 21 are removably mounted on a feed table 23 in parallel with each other perpendicularly to the directions of forward/backward movements of the feed table 23. The feed table 23 is slidably guided by a pair of guide rails 22, 22. A ball screw 24 extends through the feed table 23 in a direction of its sliding on the guide rails 22, whereby the feed table 23 is moved forward and backward by respective normal and reverse rotations of a feed motor 25 connected to one end of the ball screw 24, to selectively bring a selected one of the tape cassettes 21 to a suction station for the mounting heads 13. Each tape cassette 21 contains a roll of a carrier tape C which carries electronic components A thereon at intervals of a predetermined pitch and is wound around a tape reel 26, and the electronic components A are sequentially picked up by a corresponding one of the suction nozzles 14 by vacuum as the carrier tape C is unwound from the tape reel 26.

The mounting section 4 is comprised of an X–Y table 31 for moving the circuit board B placed thereon in the directions of an X axis and a Y axis, a feed conveyor 32 and a delivery conveyor 33 arranged to face respective opposite longitudinal ends of the X–Y table 31, and a circuit board transfer device 34 for transferring a circuit board B on the feed conveyor 32 onto the X–Y table 31 and at the same time transferring a preceding circuit board B already placed on the X–Y table onto the delivery conveyor 33. That is, the circuit board B sent to a downstream end of the feed conveyor 32 is transferred by the circuit board transfer device 34 onto the X–Y table 31, and at the same time, the circuit board B having the electronic components A mounted thereon is transferred by the circuit board transfer device 34 onto the delivery conveyor 33. The circuit board B placed on the X–Y table 31 is moved to its predetermined positions by the X–Y table 31 such that specific portions thereof are sequentially brought to a mounting station for the mounting heads 13, at which each electronic component A held at a selected suction nozzle 14 of each mounting head 13 is mounted at its specific portion of the circuit board.

The index unit 11 of the main unit 2, which forms the main part of the whole driving system of the apparatus, is supported by a support table 15. The index unit 11 intermittently rotates the rotary table 12, and at the same time causes various devices mounted on the main unit 2 to operate in a manner synchronous with a repetition period of intermittent rotation of the rotary table 12.

The rotary table 12 is rigidly mounted on a vertical shaft 16 extending perpendicularly downward from the index unit 11 and is driven for clockwise intermittent rotation as viewed in FIG. 2. The twelve mounting heads 13 arranged at circumferential intervals along the periphery of the rotary table 12 are vertically movably mounted on the periphery of the rotary table 12 via respective brackets 17. In the present embodiment, the rotary table 12 performs twelve intermittent rotations or index motions to make one complete rotational turn in a manner corresponding to the number of mounting heads 13. The mounting heads 13, which intermittently move about the rotational axis of the rotary table 12, are sequentially brought to twelve stations including the suction station in the feeding section, at which electronic components are picked up by vacuum by respective selected suction nozzles 14, and the mounting station in the mounting section, at which the picked electronic components are sequentially mounted on a circuit board as well as a station at which an image of the picked electronic component is taken and a position thereof is corrected if required, and another station at which nozzles are changed (switched).

Figure 3:
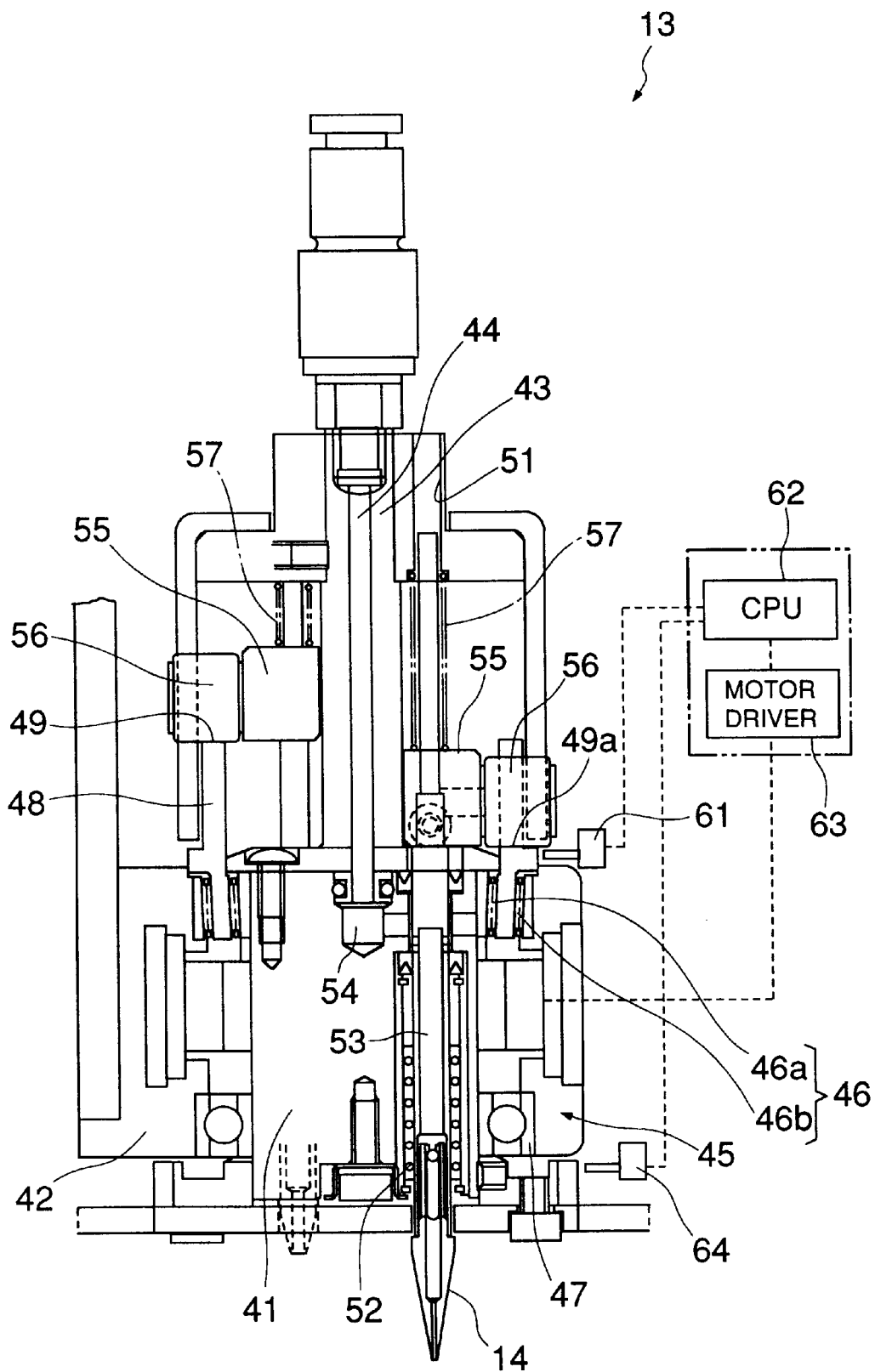
FIG. 3 is a side sectional view of the mounting head according to the first embodiment.

As shown in FIG. 3, each mounting head 13 includes a nozzle holder 41 having a plurality of (approximately five, in the present embodiment) suction nozzles 14 arranged at circumferentially equal intervals on the periphery thereof in a manner capable of projecting and retracting vertically, a holder support member 42 secured to the bracket 17 on the main unit 2 and rotatably supporting the nozzle holder 41, and a passage member 43 mounted vertically on an upper surface of the nozzle holder 41 and having a vacuum passage 44 formed through a central portion thereof along the vertical axis thereof. Arranged between the nozzle holder 41 and the holder support member 42 is a motor (rotation drive means: stepping motor) 45 which incorporates the nozzle holder 41 as a rotor and the holder support member 42 as a stator. The motor 45 drives the nozzle holder 41 for rotation with respect to the holder support member 42, causing the suction nozzles 14 to move about the vertical axis of the nozzle holder 41.

Further, between the nozzle holder 41 and the holder support member 42, there are provided an upper bearing 46 and a lower bearing 47. The upper bearing 46 is comprised of an upper inner bearing (normal rotation clutch) 46a arranged on a nozzle holder side and an upper outer bearing (reverse rotation clutch) 46b arranged on a holder support member side. Sandwiched between the bearings 46a, 46b is a lower portion of an end cam 48 for causing each of the suction nozzles 14 to project downward from the nozzle holder 42 and retract upward into the same. The upper inner and outer bearings 46a, 46b are special roller bearings, each of which is comprised of lots of rollers arranged at the same helix angle to collectively take on the general shape of the periphery of a truncated cone which decreases in diameter to a lower end thereof. This structure prohibits rotation of the bearings 46a, 46b in a helical direction, since the bearings 46a, 46b bite in a member supporting the bearings 46a, 46b, and permits only rotation of the same in a direction reverse to the helical direction. That is, the bearings 46a, 46b each serve as a so-called one-way clutch.

Thus, the upper inner bearing 46a interposed between the nozzle holder 41 and the end cam 48 permits only normal rotation of the nozzle holder 41, i.e. clockwise rotation of the same as viewed from below, while the upper outer bearing 46b interposed between the holder support member 42 and the end cam 48 permits only reverse rotation of the nozzle holder 41, i.e. counterclockwise rotation of the same as viewed from below. Accordingly, when the nozzle holder 41 is rotated by the motor 45 in the normal direction, the end cam 48 is prohibited from rotation in a state held by the holder support member 42, whereas when the nozzle holder 41 is rotated in the reverse direction, the end cam 48 performs rotation (reverse rotation) in unison with the nozzle holder 41.

Figure 4:
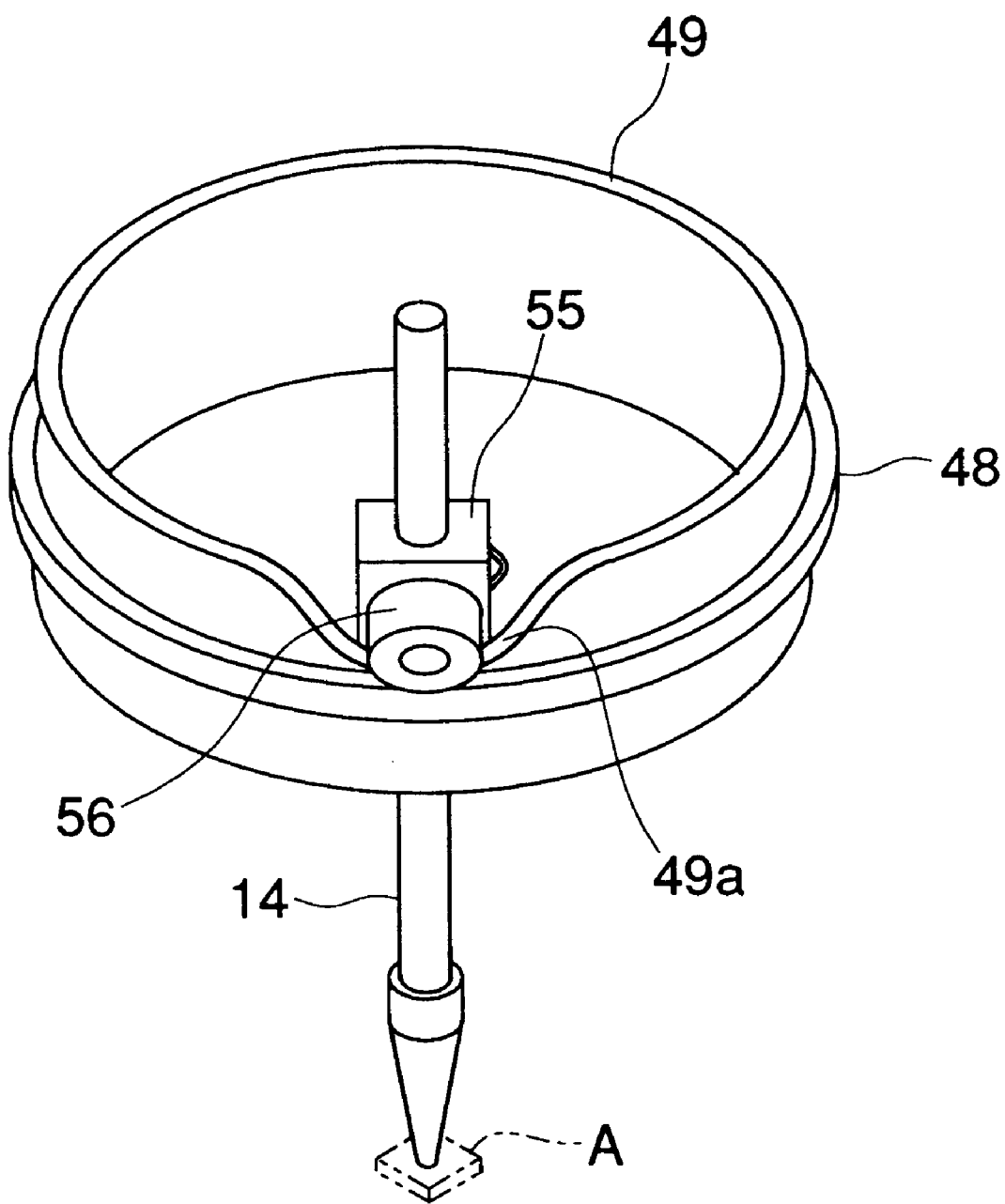
FIG. 4 is a perspective view showing an end cam of the FIG. 3 mounting head and component parts associated with the end cam.

As shown in FIGS. 3 and 4, the end cam 48 is formed to have an annular shape and has an upper end thereof formed with a cam surface 49. At a portion of the cam surface 49, there is formed a nozzle-projecting surface 49a for lowering a suction nozzle 14 to cause the same to project downward from the lower end face of the nozzle holder 41. The lower portion of the end cam 48 supported by the upper inner bearing 46a and the upper outer bearing 46b in a sandwiched manner as described above is formed to have a slightly tapering shape such that it can maintain proper contact with the two bearings 46a, 46b.

Each of the suction nozzles 14 is arranged such that it can move upward and downward (i.e. it can project and retract vertically), with its upper portion being guided through a guide hole 51 extending through the passage member 43 and its lower portion being guided by a roller guide 52 provided at the bottom of the nozzle holder 41. The lower portion of the suction nozzle 14 is formed with a suction hole 53 extending along the vertical axis of the suction nozzle 14. The suction hole 53 has an upper end communicating with a vacuum chamber 54 of the nozzle holder 41. The vacuum chamber 54 communicates with the vacuum passage 44 formed through the passage member 43. Further, the suction nozzles 14 each have a support block 55 secured to an upper intermediate portion thereof by a screw, for supporting a roller follower 56 in a manner rollable on the end cam 48.

A compression spring 57 is arranged between the passage member 43 and the support block 55 in a manner wound around the upper portion of each of the suction nozzles 14. The compression spring 57 urges the suction nozzle 14 in a projecting direction and at the same time allows reliable operation of the roller follower 56 on the end cam 48. When the roller follower 56 is rolling on the nozzle-projecting surface 49a, the suction nozzle 14 is held in a projected state by the urging force of the compression spring 57, while when the roller follower 56 is rolling on the other portion of the cam face 49 than the nozzle-projecting surface 49a, the suction nozzle 14 is held in a retracted state against the urging force of the compression spring 57.

On the other hand, as shown in FIG. 3, each of the mounting heads 13 is provided with a cam encoder (cam position-detecting means) 61 for detecting a rotational angle of the end cam 48, more specifically, a rotational position of the nozzle-projecting surface 49a of the end cam 48. The cam encoder 61 is connected to a CPU (control means) 62 to which is connected the motor 45 via a motor driver (control means) 63. Basically, the position of the nozzle-projecting surface 49a corresponds to a projecting position which is the absolute position of the mounting head 13. However, it often happens that the position of the nozzle-projecting surface 49a deviates from the corresponding projecting position due to correction of rotational position (correction in a θ direction) of an electronic component A picked up by the suction nozzle. The cam encoder 61 detects a deviation in angle between the position of the nozzle-projecting surface 49a and the corresponding projecting position and causes the motor driver 63 to drive the motor 45 (for reverse rotation) for compensation for the detected deviation.

The mounting head 13 is also provided with a nozzle encoder (nozzle position-detecting means) 64 for detecting a rotational angle of each of the suction nozzles 14, more specifically a rotational position to which the suction nozzle 14 is brought. The nozzle encoder 64 is also connected to the CPU 62. In order to move a desired one of the suction nozzles 14 to a desired position, the motor 45 is driven to cause the nozzle holder 41 to rotate (in the normal direction) in a predetermined number of steps, with reference to results of detection by the nozzle encoder 64.

Now, description will be made of a sequence of operations (nozzle-changing operation) for causing a selected one of the suction nozzles 14 to project. First, the nozzle holder 41 is driven for reverse rotation by the motor 45. The reverse rotation of the nozzle holder 41 causes the end cam 48 to rotate in unison with the nozzle holder 41 in the same direction. The motor 45 is driven for rotation in a predetermined number of steps with reference to results of detection by the cam encoder 61, so as to move the nozzle-projecting surface 49a of the end cam 48 to a projecting position for causing the selected suction nozzle 14 to project. Thus, the nozzle-projecting surface 49a of the end cam 48 is moved to the projecting position in advance.

Then, the motor 45 is driven for normal rotation in a predetermined number of steps with reference to results of detection by the nozzle encoder 64, whereby the nozzle holder 41 performs normal rotation to bring the suction nozzle 14 selected for use to the nozzle-projecting surface 49a, i.e. the projecting position. When brought to the nozzle-projecting surface 49a, the selected suction nozzle 14 is lowered by cam action on the nozzle-projecting surface 49a, and the end of the suction nozzle 14 is caused to project downward from the lower end face of the nozzle holder 41.

As described above, according to the present embodiment, it is possible to rotate the nozzle holder 41 in the normal or reverse direction to thereby selectively rotate the nozzle holder 41 alone or both the end cam 48 and the nozzle holder 41 and then cause a desired suction nozzle 14 to project at a desired projecting position by cam action between the end cam 48 and the roller follower 56. That is, the suction nozzle 14 selected for use can be caused to project from the nozzle holder at a proper position with accuracy by single rotation drive means. In the present embodiment, since the cam action is utilized to cause a selected suction nozzle to project from the nozzle holder, it is not required to strike upward the other suction nozzles 14 relative to the selected one, as in the prior art, so that it is possible to prevent the service life of each suction nozzle 14 from being shortened due to the striking of the end of the suction nozzle 14 against the stopper.

Although in the embodiment, the roller follower which rolls on the cam surface is used as a cam follower, this is not limitative, but a cam follower of a normal type which slides on the cam surface may be used.

Next, description will be made of a mounting head according to a second embodiment of the invention with reference to FIGS. 5 to 7A, 7B. The second embodiment is distinguished from the first embodiment in that the mounting head has a connecting member for selectively establishing a connection between an end cam and a rotatable nozzle holder or a connection between the end cam and a stationary holder support member.

Figure 5:
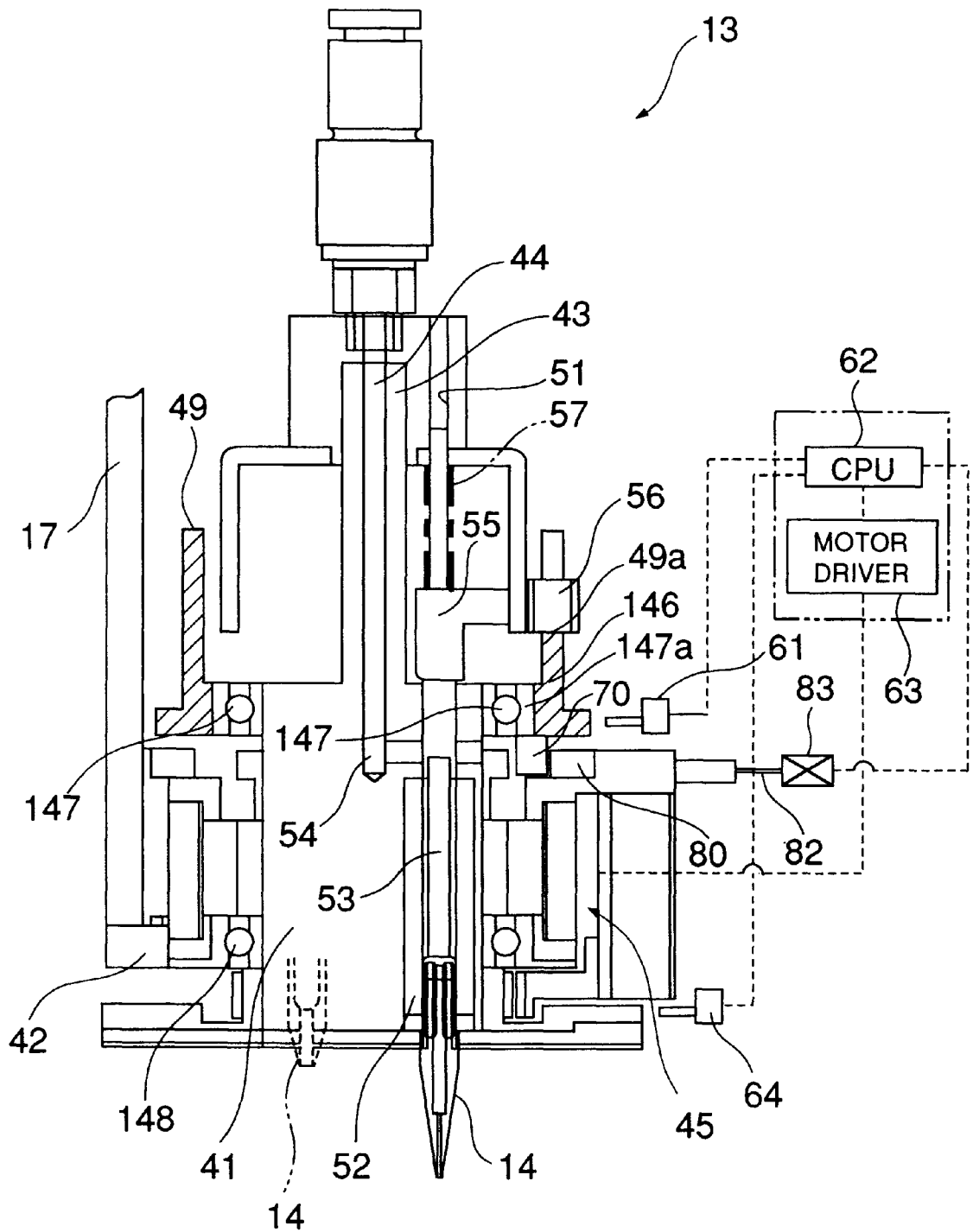
FIG. 5 is a side sectional view of a mounting head according to a second embodiment of the invention.
Figure 6:
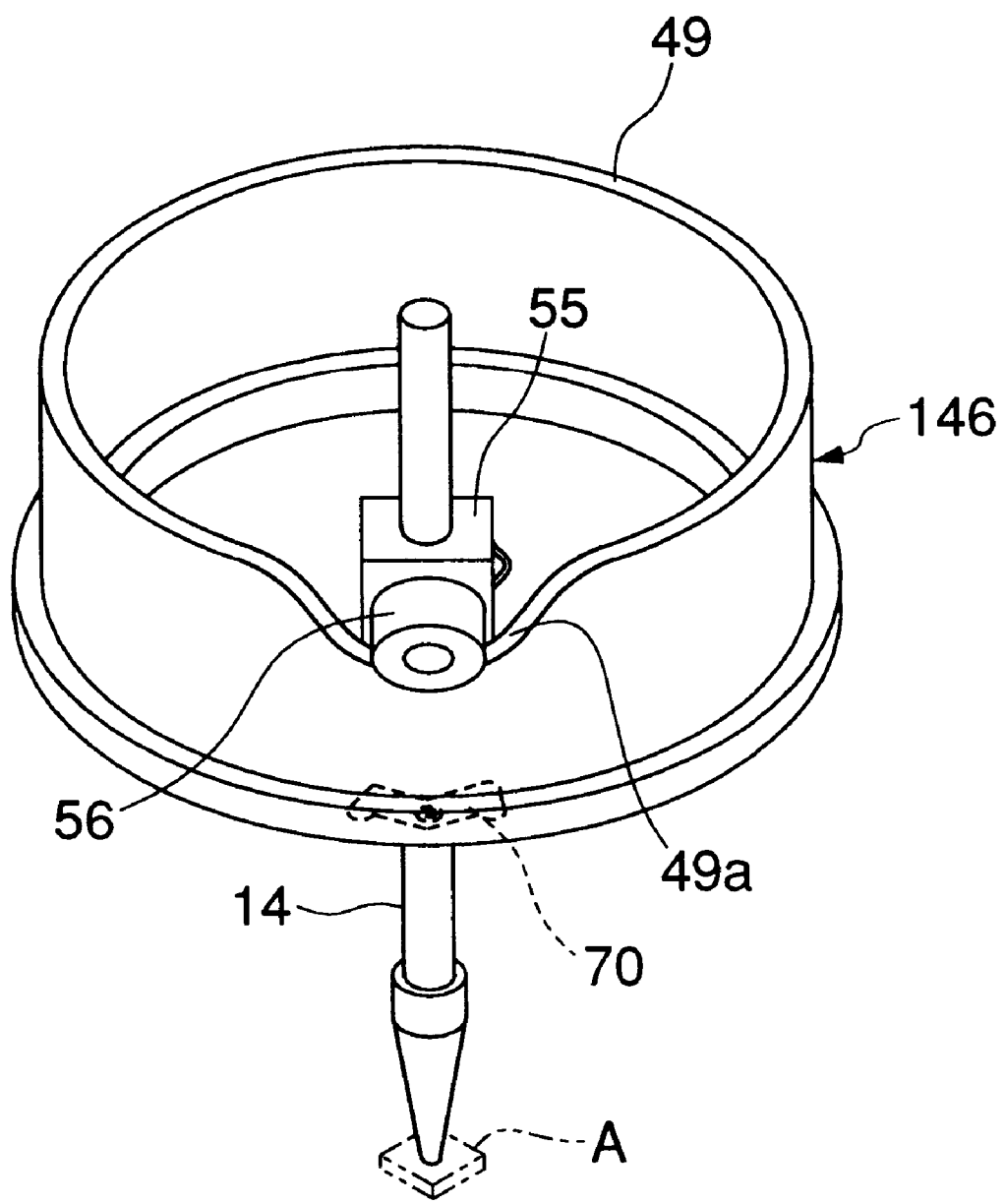
FIG. 6 is a perspective view showing an end cam of the FIG. 5 mounting head and component parts associated with the end cam.

As shown in FIG. 5, arranged above an upper end of the holder support member 42 is the end cam 146 for causing each suction nozzle 14 to project and retract vertically. The end cam 146 is integrally formed with an outer race 147a of an upper bearing 147 interposed between the end cam 146 and the nozzle holder 41. Further, a lower bearing 48 is interposed between the holder support member 42 and the nozzle holder 41. That is, the nozzle holder is supported in a rotatable manner with respect to the stationary holder support member 42, and the end cam 146 is supported in a rotatable manner with respect to the nozzle holder 41. The end cam 146 is formed to have an annular shape, as shown in FIG. 6, and has an upper end thereof formed with a cam surface 49. At a portion of the cam surface 49, there is formed a nozzle-projecting surface 49a for lowering any one of the suction nozzles 14 to cause the same to project downward from the nozzle holder.

Figure 7A:
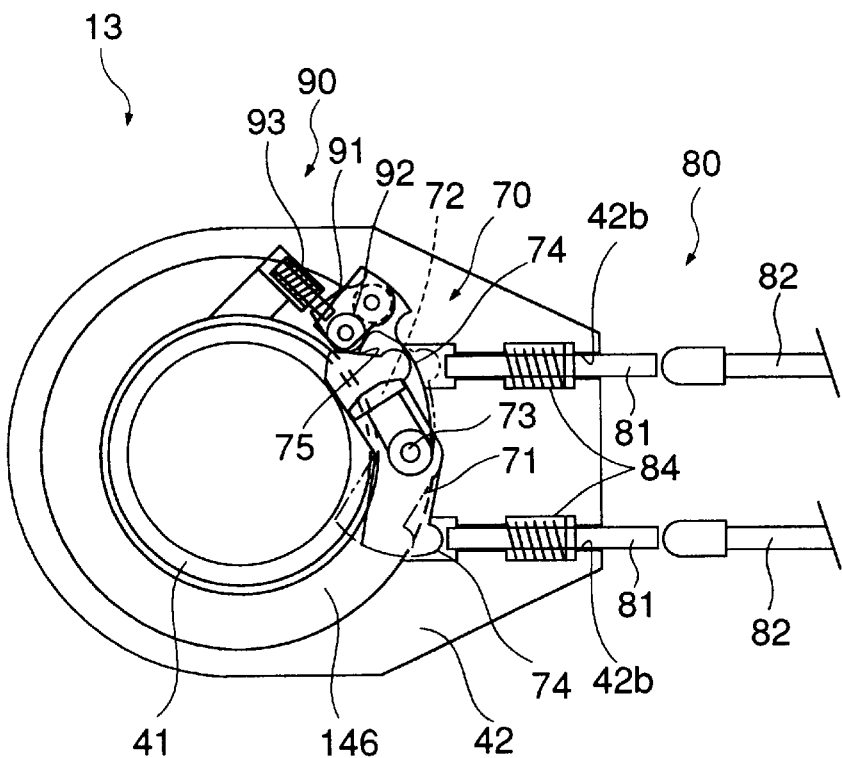
FIGS. 7A and 7B are views showing a connecting member of the FIG. 5 mounting head and component parts associated with the connecting member.
Figure 7B:
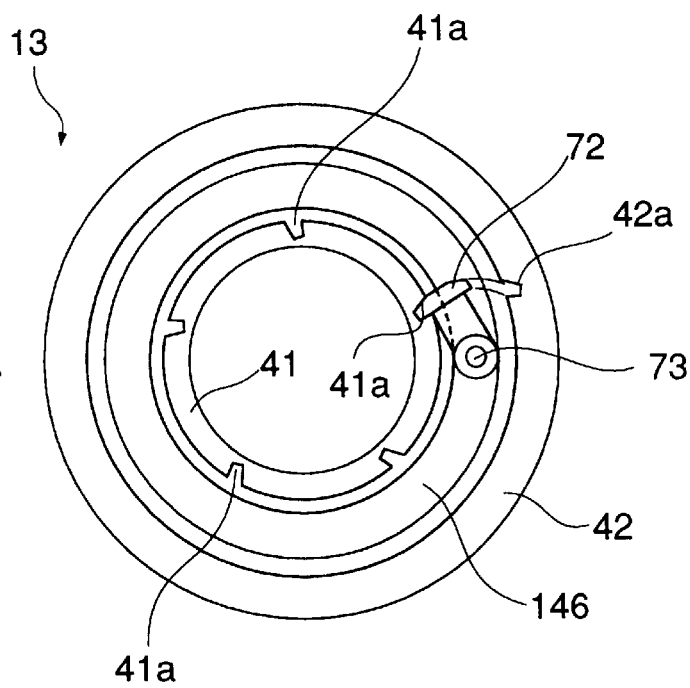

In the mounting head 13 constructed as above, on an underside surface of the end cam 146, more specifically, on a portion of the underside surface of the end cam 146 vertically opposite to the nozzle-projecting surface 49a, there is provided the connecting member 70 for selectively establishing a connection between the end cam 146 and the nozzle holder 41 or a connection between the end cam 146 and the holder support member 42 (see FIG. 6). Further, the holder support member 42 is provided with a switching mechanism 80 for causing the connecting member 70 to carry out the switching operation. As shown in FIG. 7A, the connecting member 70 is comprised of a main member 71, a hook 72 fixedly attached to an underside surface of the main member 71, and a support pin 73 for pivotally supporting the main member 71 on the underside surface of the end cam 146.

The main member 71 is in the form of a general L-shape, as viewed in plan view, bent toward the nozzle holder 41 with the support pin 73 as a center. The main member 71 has a contact projection 74 formed at an outer portion of each of opposite ends of the main member 71, for contact with the switching mechanism 80. Further, one of the opposite ends of the main member 71 is formed with an engaging portion 75 for engagement with a click mechanism 90, referred to hereinafter, in a manner continuous with the contact projection 74. The hook 72 is fixedly attached to the underside surface of the main member 71 in the immediate vicinity of the engaging portion 75. As the main member is pivotally moved, one end of the hook 72 engages with a stator-side hook groove 42a (see FIG. 7B) formed in the holder support member 42, or the other end of the same engages with any one of five rotor-side hook grooves 41a (see FIG. 7B) formed in the nozzle holder 41. The five rotor-side hook grooves 41a are formed in a manner corresponding to the five suction nozzles 14, respectively.

Similarly to the connecting member 70, the click mechanism 90 is mounted on the underside surface of the end cam 146. The click mechanism 90 includes a roller holder 91 pivotally mounted on the underside surface of the end cam 146, a click roller 92 rotatably mounted on the roller holder 91, and a spring 93 urging the click roller 92 toward the connecting member 70 via the roller holder 91. The click roller 92 abuts against the engaging portion 75 of the connecting member 70 in a state urged by the spring 93, and engages with the engaging portion 75 in a clicking manner in accordance with pivotal motion of the connecting member 70 to thereby hold the hook 72 in engagement with the stator-side hook groove 42a or any one of the rotor-side hook grooves 41a.

The switching mechanism 80 includes a pair of urging rods 81, 81 for pushing the pair of contact projections 74, 74 of the connecting member 70, respectively, and a pair of push rods 82, 82 for pushing the pair of urging rods 81, 81, respectively. The pair of push rods 82, 82 are connected to a drive unit 83, referred to hereinafter, for selectively driving the push rods 82, 82 for reciprocating motion. Each of the urging rods 81 is inserted-through a guide hole 42b formed through the holder support member 42, such that the urging rod 81 can reciprocate along the guide hole 42b, and urged backward or away from the end cam 146 by a coiled spring 84 wound around the urging rod 81. When an upper one (as viewed in FIG. 7A) of the urging rods 81 is moved forward by an upper one (as viewed in the same) of the push rods 82, one (upper one) of the contact projections 74 is moved by the upper urging rod 81, whereby the connecting member 70 performs counterclockwise pivotal motion (as viewed in the figure) and the hook 72 engages with one of the rotor-side hook grooves 41a. Inversely, when a lower one of the urging rods 81 is moved forward by a lower one of the push rods 82, the other contact projection (lower one) 74 is moved by the lower urging rod 81, whereby the connecting member 70 performs clockwise pivotal motion (as viewed in the figure) and the hook 72 engages with the stator-side hook groove 42a.

When the hook 72 of the connecting member 70 is brought into engagement with the stator-side hook groove 42a, the nozzle holder 41 alone performs normal or reverse rotation with the end cam 146 being held by the holder support member 42, whereas when the hook 72 is brought into engagement with one of the rotor-side hook grooves 41a, the nozzle holder 41 performs normal or reverse rotation in unison with the end cam 146.

Similarly to the mounting head 13 according to the first embodiment, each of the mounting heads 13 is provided with a cam encoder (cam position-detecting means) 61 and a nozzle encoder each connected to a CPU (control means) 62. In the second embodiment, however, the CPU 62 is connected not only to the motor 45 but also to the drive unit 83, via a motor driver (control means) 63. Further, the present embodiment makes it possible to drive the nozzle holder 41 by the motor 45 for normal or reverse rotation in a predetermined number of steps, with reference to results of detection by the nozzle encoder 64, in order to move a desired one of the nozzles 14 to a desired position.

Next, description will be made of a sequence of operations (nozzle-changing operation) for causing a selected one of the suction nozzles 14 to project from the nozzle holder. First, since the hook 72 of the connecting member 70 is engaged with one of the rotor-side hook grooves 41a (corresponding to a suction nozzle 14 used in an immediately preceding operation), the end cam 146 is driven by the motor 45 for rotation in unison with the nozzle holder 41 so as to bring the connecting member 70 to a home position thereof (i.e. a position opposed to the switching mechanism 80). Of course, the end cam 146 is rotated, with reference to results of detection by the cam encoder 61, in either a normal rotational direction or a reverse rotational direction depending on which direction requires rotation through a smaller rotational angle. The fact that the connecting member 70 is thus moved to its home position means that the nozzle-projecting surface 49a of the end cam 146 is also brought to the home position. That is, the home position is a projecting position at which the selected suction nozzle 14 is caused to project from the nozzle holder.

Then, the switching mechanism 80 is operated to bring the hook 72 into engagement with the stator-side hook groove 42a. Then, the nozzle holder 41 alone is driven by the motor 45 for rotation in a predetermined number of steps with reference to results of detection by the nozzle encoder 64, whereby the suction nozzle 14 selected for use is moved to the home position. When brought to the nozzle-projecting surface 49a, the suction nozzle 14 is lowered by cam action on the nozzle-projecting surface 49a, and the lower end of the suction nozzle 14 is caused to project downward from a lower end face of the nozzle holder 41. At this time point, the hook 72 of the connecting member 72 is brought again into engagement with a rotor-side hook groove 41a corresponding to the suction nozzle 14, so as to hold the suction nozzle 14 in the lowered state.

It is preferred that the rotating operation described above is carried out during movement of the suction nozzle 14 between stations on the way from the mounting station to the suction station. More specifically, since the push rods 82 are provided on the main unit side, switching operation for engagement of the hook 72 with the stator-side hook groove 42a or engagement of the same with the rotor-side hook groove 41a should be performed at a station, while rotation of the nozzle holder 41 (and the end cam 146) should be performed during movement of the suction nozzle 14 between stations. For this purpose, actually, the pair of push rods 82 are arranged at respective different stations, although they are depicted in parallel with each other in FIG. 7A for convenience of description.

As described above, according to the present embodiment, since the end cam 146 is interposed between the movable nozzle holder 41 and the stationary holder support member 42 for selective connection between the end cam 146 and the nozzle holder 41 or between the end cam 146 and the holder support member 42 by the connecting member 70, switching between the two connections and rotation of the nozzle holder 41 makes it possible cause a desired one of the suction nozzles 14 to project at a desired projecting position by cam action between the end cam 48 and the roller follower 56. Therefore, the second embodiment provides the same effect as obtained from the first embodiment. Further, since other operations than the switching operation described above can be carried out during movement of the mounting head 13 between stations, it is possible to minimize an adverse effect of the switching operation of the suction nozzle 14 on tact time of the overall operation for mounting electronic components on a circuit board.

It should be noted that the switching mechanism (and the drive unit) of the second embodiment may be comprised of a solenoid and installed on the mounting head (holder support member).

It is further understood by those skilled in the art that the foregoing are preferred embodiments of the invention, and that various changes and modifications may be made without departing from the spirit and scope thereof.

What is claimed is:

1. A mounting head for an electronic component mounting apparatus, said head comprising:
    a nozzle holder;
    a plurality of suction nozzles arranged circumferentially about a vertical axis of said nozzle holder in a manner such that each suction nozzle is capable of projecting from said nozzle holder and retracting in said nozzle holder;
    a holder support member supporting said nozzle holder in a manner such that said nozzle holder can rotate about said vertical axis thereof;
    rotation drive means for driving said nozzle holder for rotation in normal and reverse directions, said rotation drive means incorporating said nozzle holder as a rotor and said support member as a stator, said rotation drive means being arranged between said nozzle holder and said holder support member, and wherein said nozzle holder is rotated by said rotation drive means to bring one of said suction nozzles selected for use to a projecting position at which it is to project from a lower end face of said nozzle holder;
    a cam follower mounted on each of said suction nozzles; and
    an annular end cam with which said cam followers of said plurality of suction nozzles are in contact in a manner such that said cam followers move on said annular end cam as said nozzle holder is rotated, said annular end cam being formed with a nozzle-projecting surface for causing said selected one of said suction nozzles corresponding in position thereto to project from said lower end face of said nozzle holder.

2. A mounting head for an electronic component-mounting apparatus, including a nozzle holder having a plurality of suction nozzles arranged circumferentially about a vertical axis thereof in a manner such that each suction nozzle is capable of projecting from said nozzle holder and retracting in said nozzle holder, a holder support member supporting said nozzle holder in a manner such that said nozzle holder can rotate about said vertical axis thereof, and rotation drive means for driving said nozzle holder for rotation in normal and reverse directions, wherein said nozzle holder is rotated by said rotation drive means to bring one of said suction nozzles selected for use to a projecting position, and said selected one is caused to project from a lower end face of said nozzle holder at said projecting position, the mounting head comprising:
    a plurality of cam followers mounted at respective upper portions of said suction nozzles; and
    an annular end cam with which said cam followers are in contact in a manner such that said cam followers can move on said annular end cam, said annular end cam being formed with a nozzle-projecting surface for causing one of said suction nozzles corresponding in position thereto to project from said lower end face of said nozzle holder;
    wherein said end cam has a lower portion interposed between said holder support member and said nozzle holder, and
    wherein said mounting head includes a normal rotation clutch interposed between said nozzle holder and said lower portion of said end cam, for permitting only normal rotation of said nozzle holder, and a reverse rotation clutch interposed between said holder support member and said lower portion of said end cam, for permitting only reverse rotation of said nozzle holder.

3. A mounting head according to claim 2, further comprising:
    cam position-detecting means for detecting a rotational position of said nozzle-projecting surface of said end cam;
    nozzle position-detecting means for detecting a rotational position of each of said suction nozzles on said nozzle holder; and
    control means for controlling said normal rotation and said reverse rotation of said nozzle holder driven by said rotation drive means, in response to respective detection signals from said cam position-detecting means and said nozzle position-detecting means.

4. A mounting head for an electronic component mounting apparatus comprising:
    a nozzle holder;
    a plurality of suction nozzles arranged circumferentially about a vertical axis of said nozzle holder in a manner such that each suction nozzle is capable of projecting from said nozzle holder and retracting in said nozzle holder;
    a holder support member supporting said nozzle holder in a manner such that said nozzle holder can rotate about said vertical axis thereof;
    rotation drive means for driving said nozzle holder for rotation in normal and reverse directions, wherein said nozzle holder is rotated by said rotation drive means to bring one of said suction nozzles selected for use to a projecting position at which it is to project from a lower end face of said nozzle holder;

a plurality of cam followers mounted at respective upper portions of said suction nozzles;

an annular end cam with which said cam followers are in contact in a manner such that said cam followers can move on said annular end cam, said annular end cam being formed with a nozzle-projecting surface for causing said selected one of said suction nozzles corresponding in position thereto to project from said lower end face of said nozzle holder;

a connecting member provided on said end cam for selectively establishing one of a connection between said end cam and said nozzle holder such that both the end cam and the holder are rotated by the rotation drive means or a connection between said end cam and said holder support member such that only the nozzle holder is caused to rotate by the rotation drive means; and switching means for causing said connecting member to switch between said connections.

5. A mounting head for an electronic component-mounting apparatus, including a nozzle holder having a plurality of suction nozzles arranged circumferentially about a vertical axis thereof in a manner such that each suction nozzle is capable of projecting from said nozzle holder and retracting in said nozzle holder, a holder support member supporting said nozzle holder in a manner such that said nozzle holder can rotate about said vertical axis thereof, and rotation drive means for driving said nozzle holder for rotation in normal and reverse directions, wherein said nozzle holder is rotated by said rotation drive means to bring one of said suction nozzles selected for use to a projecting position, and said selected one is caused to project from a lower end face of said nozzle holder at said projecting position, the mounting head comprising:

a plurality of cam followers mounted at respective upper portions of said suction nozzles; and an annular end cam with which said cam followers are in contact in a manner such that said cam followers can move on said annular end cam, said annular end cam being formed with a nozzle-projecting surface for causing one of said suction nozzles corresponding in position thereto to project from said lower end face of said nozzle holder;

a connecting member provided on said end cam, for selectively establishing a connection between said end cam and said nozzle holder or a connection between said end cam and said holder support member; and switching means for causing said connecting member to switch between said connections;

cam position-detecting means for detecting a rotational position of said nozzle-projecting surface of said end cam;

nozzle position-detecting means for detecting a rotational position of said each of said suction nozzles on said nozzle holder; and control means for controlling said rotation of said nozzle holder driven by said rotation drive means and switching operation of said switching means, in response to respective detection signals from said cam position-detecting means and said nozzle position-detecting means.

* * * * *